Figure 1:
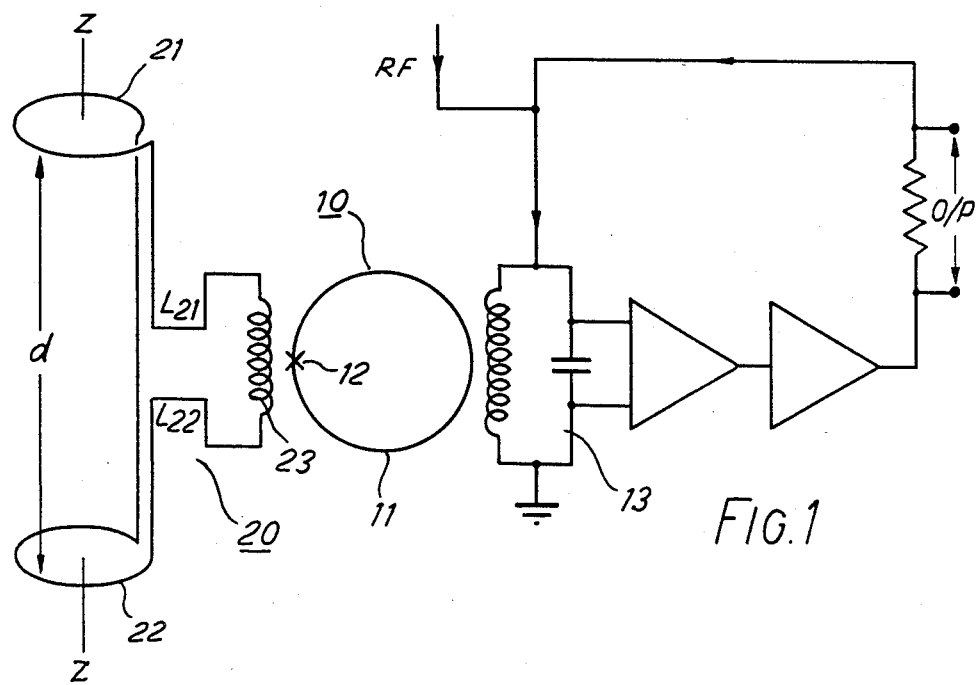

United States Patent [19]

Vaidya

[11] Patent Number: 4,549,135
[45] Date of Patent: Oct. 22, 1985

[54] MAGNETIC FIELD GRADIOMETER WITH TRIMMING ELEMENT

[75] Inventor: Ashok W. Vaidya, High Wycombe, England

[73] Assignee: EMI Limited, Hayes, England

[21] Appl. No.: 455,051

[22] Filed: Jan. 3, 1983

[30] Foreign Application Priority Data

Feb. 16, 1982 [GB] United Kingdom ................. 8204534

[51] Int. Cl.$^4$ ............................................ G01R 33/035
[52] U.S. Cl. ..................................... 324/248; 361/141
[58] Field of Search ............... 324/248, 224, 225, 244; 377/93; 361/19, 141; 307/306

[56] References Cited

PUBLICATIONS

Wynn, et al., "Advanced Super Conducting Gradiometer . . . Technique", Mar. 1975, IEE, Transactions on Magnetics, vol. MAG-11, No. 2, pp.-701-707.

Article "Josephson Effect Devices", by John Clarke, Phys. Bull., vol. 30, pp. 206-208, 1979.

Primary Examiner—Gerard R. Strecker
Assistant Examiner—Walter E. Snow
Attorney, Agent, or Firm—Fleit, Jacobson, Cohn & Price

[57] ABSTRACT

A magnetic field gradiometer includes a pair of coils, encompassing different regions of space. A SQUID is provided to detect a difference in flux linking the coils thereby to provide a measure of a magnetic field gradient between the coils. A control element of a superconducting material is provided in the vicinity of the coils and a heater is controlled to vary the proportion of the element assuming the superconducting state. By suitably varying this proportion the balance condition of the coils can be altered. The control element may operate in a feed back circuit. A coil subjects both coils to an alternating magnetic field at a preset frequency. A component in the output of the SQUID having this frequency is used to control the heater.

13 Claims, 3 Drawing Figures

MAGNETIC FIELD GRADIOMETER WITH TRIMMING ELEMENT

This invention relates to magnetic field gradiometers and it relates especially to the way in which the detection coils, used in a gradiometer, are balanced.

In a known form of magnetic field gradiometer a pair of superconducting detection coils are coupled to a SQUID (Superconducting Quantum Interference Device) which is capable of generating an output level indicative of a magnetic field gradient prevailing between the coils. Ideally it is preferred that the detection coils should be identical and aligned in precisely parallel planes; however this is rarely possible to achieve in practice. Hitherto, to compensate for imbalance in the coils one or more vanes, of a superconducting material, have been provided which can be moved within the vicinity of the coils until a balance condition is achieved. This technique is often difficult and time consuming to carry out successfully in practice.

It is an object of this invention to provide a gradiometer arrangement in which the above-identified problem is significantly alleviated.

According to the invention there is provided a magnetic field gradiometer comprising a coil arrangement including a first coil encompassing a first region of space and a counterwound second coil, connected in series with the first coil, encompassing a second region of space, a superconducting detection device, coupled to the coil arrangement, to generate an output signal representing a difference in magnetic flux prevailing the first and second regions of space and control means comprising a control element formed of a superconducting material and means capable of varying the proportion of said element assuming the superconducting state, the element being capable of influencing the magnetic field linking the two coils by different amounts depending on the size of said proportion.

The means capable of varying said proportion may be a heater.

Figure 2:
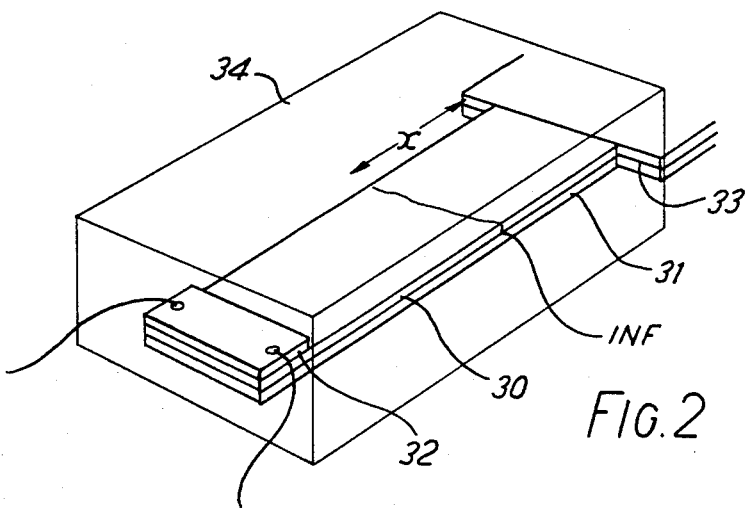
Figure 3:
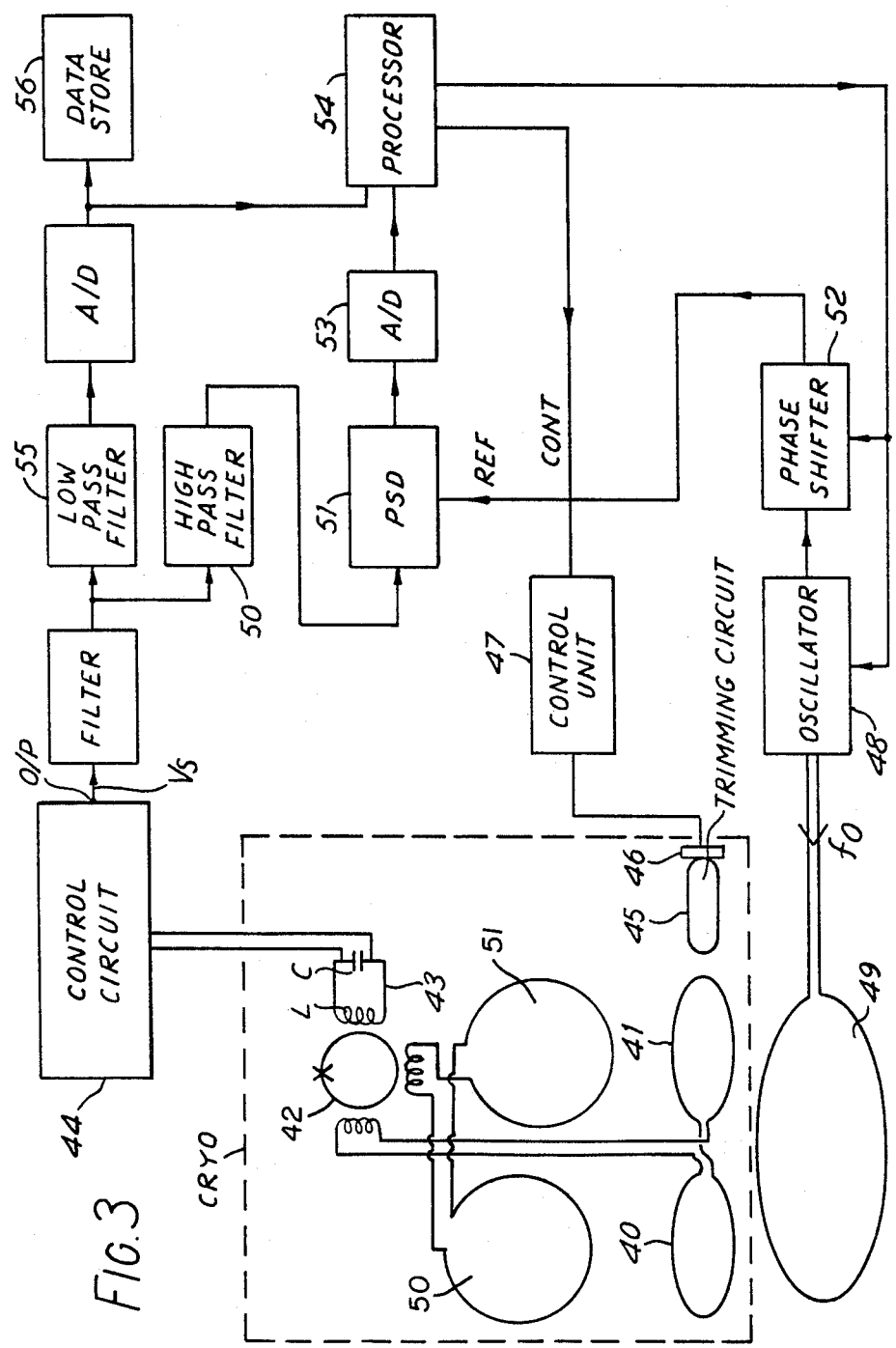

In order that the invention may be more readily understood and carried into effect specific embodiments thereof are now described by reference to the accompanying drawings of which FIG. 1 shows a magnetic field gradiometer including an RF SQUID, FIG. 2 illustrates a perspective, schematic view of a superconducting control element, and FIG. 3 illustrates a gradiometer arrangement employing a feedback control.

Embodiments of the present invention, described hereafter, include a superconducting detection device in the form of a SQUID (Superconducting QUantum Interference Device). As described in an article entitled "Josephson Effect Devices" by John Clarke (Phys Bull Vol. 30 p.206-208) a SQUID includes one or more Josephson junctions which interrupt a superconducting ring. Magnetic flux passing through the ring can then be represented in terms of an output signal generated as a result of the interference of electric current across the junction(s).

FIG. 1 shows a SQUID 10 used in a magnetic field gradiometer. The superconducting ring 11 is coupled to a flux transformer 20 including a pair of notionally identical superconducting coils 21, 22, connected in series opposition, and spaced apart by a distance d so as to encompass different regions of space. Each coil responds, in these circumstances, to the normal component (along the Z direction, in this case) of magnetic field prevailing in the respective regions to generate a corresponding induced current $i_{21}$, $i_{22}$. When a magnetic field gradient $(\delta Hz)/(\delta Z)$ exists between the coils 21, 22 the currents $i_{21}$, $i_{22}$ will be different and so a net current $\Delta i = i_{21} - i_{22}$ is generated causing flux to be linked, via coil 23, to the superconducting ring 11 of the SQUID. In the illustrated example, an RF SQUID is used having only one Josephson junction 12, RF radiation being supplied to the ring via an LC resonant circuit 13 and an output signal, indicative of a field gradient, being derived at an output location O/P.

In practice it may not be possible to provide truly identical detection coils 21, 22 whose response to a uniform magnetic field will be zero since their cross-sectional areas may be slightly different, for example. Moreover, the planes of the two coils may not be precisely parallel, as is preferred in a gradiometer system. Any imbalance in the coil system, due to a difference in coil area and/or a departure from perfect alignment may result in the generation of an output signal at O/P, even in the absence of a magnetic field gradient, and this effect tends to render the measurement of field gradient rather inaccurate and can prevent the SQUID from operating. Hitherto, this problem has been alleviated by providing one or more superconducting vanes to distort the magnetic field lines coupling the detection coils. The vanes can be moved, within the vicinity of the coils, to positions appropriate for attaining the optimum balance condition, but this often proves difficult to achieve in practice.

In accordance with present invention a different approach is adopted by providing a superconducting trimming element which is fixedly mounted near the detection coils and is provided with a heater at one end. The other end is maintained at liquid helium temperature (4.2 K.) by a heat sink and so, by heating the element, a temperature gradient is set up along its length. The quantity of heat supplied by the heater can be chosen so that only a selected portion of the element, remote from the heater, assumes the superconducting state and is effective to adjust the balance condition of the coils. By suitably regulating the amount of heat supplied the position, along the length of the element, of the superconducting/normal interface can be varied to achieve the optimum balance condition. This technique, therefore, has the advantage that it involves no mechanical movement of the trimming element. In these circumstances the superconducting portion of the element may influence the magnetic flux linking one of the detection coils more than the magnetic flux linking the other coil, to an extent sufficient to offset any inherent inbalance in the coil system itself.

FIG. 2 shows a perspective, schematic diagram of a superconducting element used in the above-described approach. The element comprises a superconducting foil 30, typically of a lead indium alloy, supported by a thermally insulating substrate 31 and having a heater 32 mounted at one end. The other end 33 of the foil is arranged to be in thermal contact with the liquid helium bath used to cool the SQUID and detection coils, thereby providing a heat sink, and both the foil and heater are encapsulated in a thermally insulating jacket possibly of epoxy resin, 34. Typically the detection coils may be 4 cm in diameter and in these circumstances the foil 30 may be about 1 cm long, 0.1 cm wide and 0.0125 cm thick, the epoxy jacket being about 1 cm thick. A heater, capable of supplying about 10 mW power to the element would then suffice to achieve adequate control over the position of the superconducting/normal interface, shown at INF in FIG. 2. It can be shown that the distance x of the interface, as measured from the end 33 is given approximately by the expression $$x = \frac{1}{r} \sinh^{-1}\left[\frac{T_c}{T_1} \sinh(r\,1)\right],$$ Equation 1 assuming the helium bath temperature to be 0° K. and where
l is the distance between the heater 32 and the end 33,
$T_c$ is the superconducting transition temperature of the foil, $T_1$ is the temperature of the heater, $$\text{and } r = \left(\frac{R_f}{R_e}\right)^{\frac{1}{2}}$$

where $R_e$ is the thermal resistivity (to the helium bath) of the epoxy resin used for the jacket 34 and $R_f$ is the thermal resistivity (to bath) of the superconducting foil.

By tailoring the film shape and the epoxy thickness appropriately it is possible to design a control element exhibiting a somewhat simpler variation of x with $T_1$ and this may be particularly advantageous in an automatic, servo controlled balancing system of the kind described hereinafter, in which a linear or logarithmic variation may be desirable.

The thermal time constant $\tau$ of the film should also be sufficiently long so that fluctuations in the liquid helium bath temperature, caused by bubbles etc., do not significantly affect the position of the interface INF. A time constant $\tau$ of 1–2 seconds should normally suffice. Moreover, the heater should preferably be powered using AC signals of a frequency exceeding that of the maximum gradiometer operating frequency thereby to eliminate the possibility of magnetic interference. Since the gradiometer normally operates at a maximum frequency of about 100 Hz, a heater frequency of about 10 kHz should eliminate the possibility of interference.

The precise position of the control element, in relation to the detection coils will depend, to some extent, on the degree of imbalance between a particular pair of coils. In general, however, the element could be positioned between the coils so that the superconducting material provided in the absence of a heating current will serve to overcompensate for any inherent imbalance between the coils. Alternatively the element could be positioned near a second pair of gradiometer coils of smaller size connected in series with the main pair. The second pair could be positioned nearby the main coils and serve only to allow the total balance of the gradiometer to be adjusted. It would reduce cross coupling effects in multiaxis gradiometer where adjusting the trim of one coil pair unintentionally affects the balance of another coil pair. A heating current can then be applied to the element so as to reduce the amount of superconducting material by an amount consistent with achieving a balance condition.

In practice, the detection coils could be balanced initially before a measurement of field gradient is made, but in an alternative approach the balance condition could be achieved continuously using an automatic balancing arrangement of the kind now described in relation to FIG. 3.

The gradiometer detection coils, shown at 40, 41, are coupled to an RF SQUID 42 which is fed, via an LC resonant circuit 43, with RF signals generated by a control circuit 44. The SQUID and detection coils are mounted within a cryostat, CRYO, and are maintained at liquid helium temperature 4.2 K. As before, the SQUID 42 is capable of generating electrical signals representing a difference in the intensity of magnetic flux linking with the two detection coils 40, 41, and these signals are amplified at 44 to produce a signal level $V_s$ at an output location O/P. Although a detected flux difference may be caused by a magnetic field gradient it could result from an inherent imbalance in the detection coils themselves. To offset imbalance in the detection coils 40, 41 a superconducting trimming element 45, of the kind described hereinbefore is fixedly mounted within the vicinity of the detection coils and is provided with a heater 46 to regulate that portion of the element assuming the superconducting state. Power supplied to the heater is regulated by a control unit 47 which responds to control signals CONT applied thereto via a feed back circuit. The feed back circuit includes an oscillator circuit 48 arranged to feed an AC signal, of frequency $f_o$, to a further coil 49 which generates an alternating magnetic field which links flux to both detection coils 40, 41, equally. If the detection coils are unbalanced then the output signal generated at O/P will contain an AC component, of frequency $f_o$, reflecting the extent of the imbalance, which can be used to generate a control signal CONT suitable for varying the heat supplied to the trimming circuit 45, in a sense appropriate to reduce the imbalance. It is assumed, in this example, that variations in the output signal Vs, caused by changes of magnetic field gradient, will occur at a relatively low frequency—typically less than 100 Hz and so signals are applied to the further coil at a relatively high frequency, $f_o$ typically between 500 Hz and 1 KHz. Corresponding signals (of frequency $f_o$) generated at the output location O/P and indicative of imbalance in the detection coils are then isolated from the total output signal $V_s$ using a high pass filter 50 and are fed to the input of a phase sensitive detector (PSD) 51. The oscillator circuit 48 also feeds a reference signal (of frequency $f_o$) to the reference input of the PSD via a phase shifter 52. An output signal generated by the PSD, representing the extent of any imbalance in the detection coils, is then digitised using an A/D converter 53 and fed to a processor 54, programmed in accordance with Equation 1, or an expression based thereon, to generate control signals CONT suitable for regulating the heater 46 in the desired manner. Lower frequency components of Vs, reflecting the magnitude of a magnetic field gradient can be isolated using a low pass filter 55 and passed to a data storage system 56 for further use. This data may also be fed to processor 54 to assist in balancing the detector coils.

Although a coil 49 is used, in the above-described example, to ascertain the balance condition of the detection coils 40, 41 other means capable of generating a magnetic field, that links equal flux to both coils such as a pair of coils or a current carrying wire placed symmetrically in relation to the detection coils could be used. Moreover, the magnetic field produced by one or more further coils 49, or a current carrying wire need not necessarily link equal amounts of magnetic flux to the detection coils. In these circumstances the processor 54 would be programmed to apply an appropriate offset to the control signals, CONT, applied to the heater 46, so as to compensate for any non uniformity in the field generated by the further coil 49. This offset can be calculated in a preliminary calibration performed in a test cryostat.

Since the fields applied by coil 49 need not necessarily link both detection coils equally it is possible to use the same coil 49 in association with a number of pairs of detection coils, e.g. pair 50, 51 each aligned to determine the field gradient prevailing along a different gradiometer axis (the x, y or z, axes, for example). Again each pair of detection coils would be calibrated initially and a respective offset signal stored in processor 54. To distinguish between magnetic fields, applied by coil 49, to the different pairs of detection coils a different frequency can be used for each. By selectively filtering the output from the SQUID a separate control signal can then be derived for application to a respective superconducting trimming circuit 45 associated with each pair gradiometer detection coils.

It will be appreciated that although the feedback arrangement has been described in relation to a superconducting trimming element of the kind using a heater, the arrangement could also be used to control movement of a trimming element within the vicinity of the detection coils.

What I claim is:

1. A magnetic field gradiometer comprising a coil arrangement including a first coil encompassing a first region of space and a counterwound second coil, connected in series with the first coil, encompassing a second region of space, a superconducting detection device coupled to the coil arrangement to generate an electrical output signal representative of a difference of magnetic flux prevailing in the first and second regions of space, a trimming element, formed of a superconducting material, and occupying a fixed position in relation to the first and second coils and having means for varying controllably the proportion of said element assuming the superconducting state thereby to regulate the relative amounts of magnetic flux linking the first and second coils.

2. A magnetic field gradiometer comprising a coil arrangement including a first coil encompassing a first region of space and a counterwound second coil, connected in series with the first coil, encompassing a second region of space, a superconducting detection device coupled to the coil arrangement to generate an electrical output signal representative of a difference of magnetic flux prevailing in the first and second regions of space, a trimming element, formed of a superconducting material, occupying a fixed position in relation to the first and second coils and having means for heating the trimming element thereby to vary controllably the proportion of said element assuming the superconducting state and so regulate the relative amounts of magnetic flux linking the first and second coils.

3. A magnetic field gradiometer according to claim 2 wherein the trimming element comprises a foil of a superconducting material mounted on a substrate, one end of said foil being in thermal contact with the heater and the other end being in thermal contact with a heat sink.

4. A magnetic field gradiometer according to claim 1 wherein said superconducting material is lead-indium alloy.

5. A magnetic field gradiometer according to claim 1 including means for subjecting said first and second coils to an alternating magnetic field at a preset frequency, means for detecting in said output signal, representing a difference in magnetic flux prevailing in said first and second regions of space, a component at the said preset frequency, and means responsive to the magnitude of the component to adjust the means capable of varying the said proportion of the element assuming the superconducting state thereby to reduce imbalance in the coils.

6. A magnetic field gradiometer according to claim 5 wherein the means for subjecting said first and second coils to an alternating magnetic field comprises a further coil arranged to subject each of said first and second coils to equal amounts of magnetic flux.

7. A magnetic field gradiometer according to claim 5 wherein said means for subjecting said first and second coils to an alternating magnetic field also subjects at least one other pair of coils to an alternating coil, the pairs of coils being arranged to detect respective external magnetic field gradients along substantially different directions.

8. A magnetic field gradiometer according to claim 2 wherein said superconducting material is lead-indium alloy.

9. A magnetic field gradiometer according to claim 3 wherein said superconducting material is lead-indium alloy.

10. A magnetic field gradiometer according to claim 6 wherein said means for subjecting said first and second coils to an alternating magnetic field also subjects at least one other pair of coils to an alternating magnetic field, the pairs of coils being arranged to detect respective external magnetic field gradients along substantially different directions.

11. A magnetic field gradiometer according to claim 2 including means for subjecting said first and second coils to an alternating magnetic field at a preset frequency, means for detecting in said output signal, representing a difference of magnetic flux prevailing in the first and second regions of space, a component at said preset frequency, and means responsive to the magnitude of said component to control said heating means thereby to reduce inbalance in the coils.

12. A magnetic field gradiometer according to claim 11 wherein the means for subjecting said first and second coils to an alternating magnetic field comprises a further coil arranged to subject each of said first and second coils to equal amounts of magnetic flux.

13. A magnetic field gradiometer according to claim 11 wherein said means for subjecting said first and second coils to an alternating magnetic field also subjects at least one other pair of coils to an alternating magnetic field, the pairs of coils being arranged to detect respective external magnetic field gradients along substantially different directions.

* * * * *